US006730841B2

(12) United States Patent
Heckeroth

(10) Patent No.: US 6,730,841 B2
(45) Date of Patent: May 4, 2004

(54) METHOD AND APPARATUS FOR MOUNTING A PHOTOVOLTAIC ROOFING MATERIAL

(75) Inventor: Steve Heckeroth, Albion, CA (US)

(73) Assignee: United Solar Systems Corporation, Troy, MI (US)

( * ) Notice: Subject to any disclaimer, the term of this patent is extended or adjusted under 35 U.S.C. 154(b) by 0 days.

(21) Appl. No.: 10/095,391

(22) Filed: Mar. 12, 2002

(65) Prior Publication Data

US 2002/0129849 A1 Sep. 19, 2002

Related U.S. Application Data

(60) Provisional application No. 60/275,662, filed on Mar. 14, 2001.

(51) Int. Cl.⁷ .................. H01L 31/048; H01L 31/042
(52) U.S. Cl. ................. 136/251; 136/244; 136/291; 52/173.3; 438/64; 257/433
(58) Field of Search ................. 136/251, 244, 136/291; 52/173.3; 438/64; 257/433

(56) References Cited

U.S. PATENT DOCUMENTS

| | | | | |
|---|---|---|---|---|
| 4,189,881 A | * | 2/1980 | Hawley ................. 52/91.3 |
| 4,485,264 A | | 11/1984 | Izu et al. ................. 136/244 |
| 4,537,838 A | | 8/1985 | Jetter et al. ................. 429/9 |
| 4,574,160 A | * | 3/1986 | Cull et al. ................. 136/245 |
| 4,674,244 A | | 6/1987 | Francovitch ................. 52/173.3 |
| 4,860,509 A | | 8/1989 | Laaly et al. ................. 52/173.3 |
| 4,886,554 A | | 12/1989 | Woodring et al. ............ 136/244 |
| 5,092,939 A | * | 3/1992 | Nath et al. ................. 136/251 |
| 5,133,810 A | * | 7/1992 | Morizane et al. ............ 136/251 |
| 5,164,020 A | * | 11/1992 | Wagner et al. ............ 136/251 |
| 5,232,518 A | * | 8/1993 | Nath et al. ................. 136/251 |
| 5,409,549 A | * | 4/1995 | Mori ................. 136/244 |
| 5,437,735 A | | 8/1995 | Younan et al. ............ 136/251 |
| 5,516,704 A | | 5/1996 | Yoshida ................. 438/62 |
| 5,575,861 A | | 11/1996 | Younan et al. ............ 136/251 |
| 5,590,495 A | | 1/1997 | Bressler et al. ............ 52/173.3 |
| 6,061,977 A | | 5/2000 | Toyama et al. ............ 52/173.3 |
| 6,063,996 A | | 5/2000 | Takada et al. ............ 136/246 |
| 6,160,215 A | | 12/2000 | Curtin ................. 136/244 |
| 6,291,761 B1 | | 9/2001 | Takada et al. ............ 136/244 |
| 6,316,283 B1 | | 11/2001 | Saurer ................. 438/52 |
| 6,323,478 B1 | | 11/2001 | Fujisaki et al. ............ 250/214 SG |
| 6,331,671 B1 | | 12/2001 | Makita et al. ............ 136/244 |
| 6,336,304 B1 | | 1/2002 | Mimura et al. ............ 52/748.1 |
| 6,553,729 B1 | * | 4/2003 | Nath et al. ................. 52/173.3 |
| 2003/0094193 A1 | * | 5/2003 | Mapes et al. ............ 136/244 |

FOREIGN PATENT DOCUMENTS

WO    WO 00/59035    10/2000

\* cited by examiner

*Primary Examiner*—Alan Diamond
(74) *Attorney, Agent, or Firm*—Gifford, Krass, Groh, Sprinkle, Anderson & Citkowski, P.C.

(57) ABSTRACT

A web of photovoltaic roofing material exhibited by an elongated, substantially thin, and flexible web including a central photovoltaic area encapsulated within a polymeric material, the polymeric material including both side and end extending edges beyond the photovoltaic area. A pair of contact terminals extend from a selected end of the flexible web and establish electrical communication with the photovoltaic area. Overlapping edges of succeeding webs of roofing material are secured in place by elongated clamping strips and batten caps. An elongated flexible web, incorporating numerous detachable and individual sections, may be wound upon a spool and the spool may in turn be secured to a trolley, such as which may be traversable along an eave extending edge of the roof for applying the photovoltaic material.

17 Claims, 10 Drawing Sheets

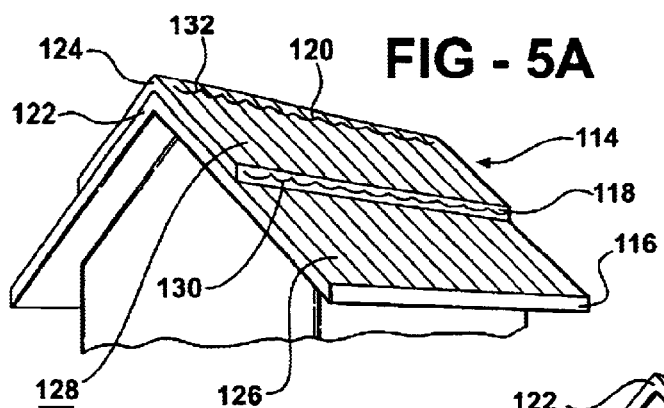
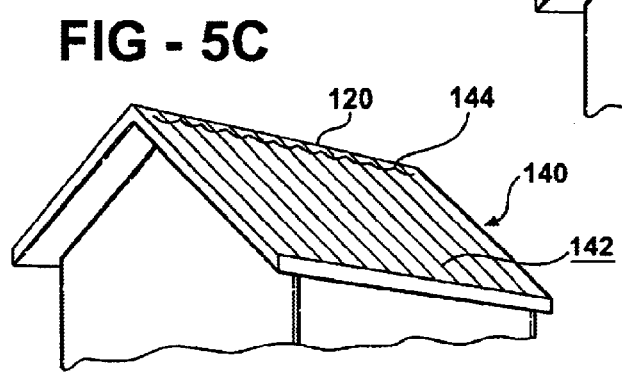
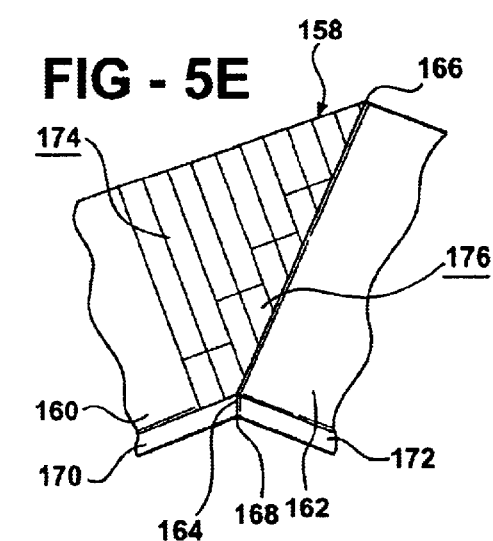
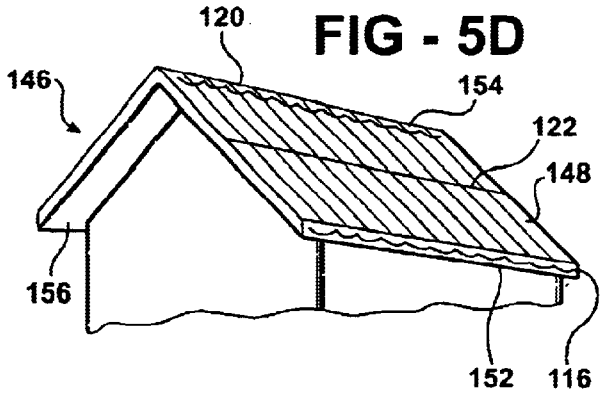
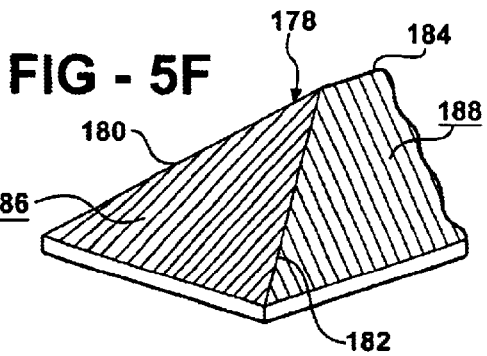

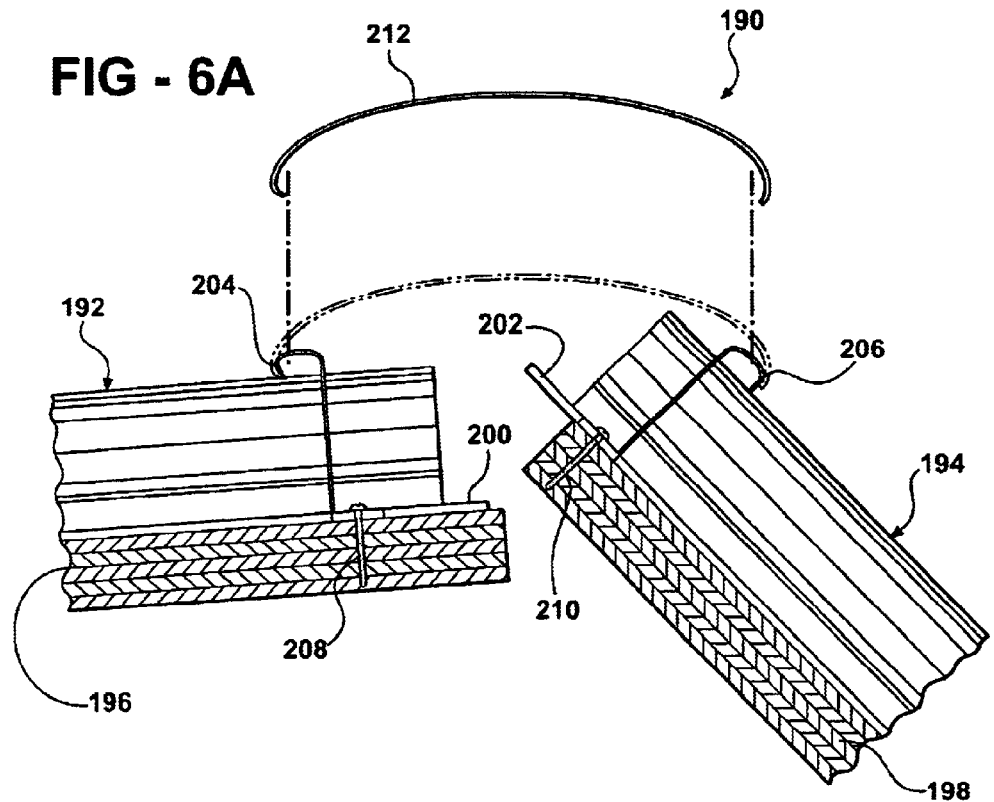
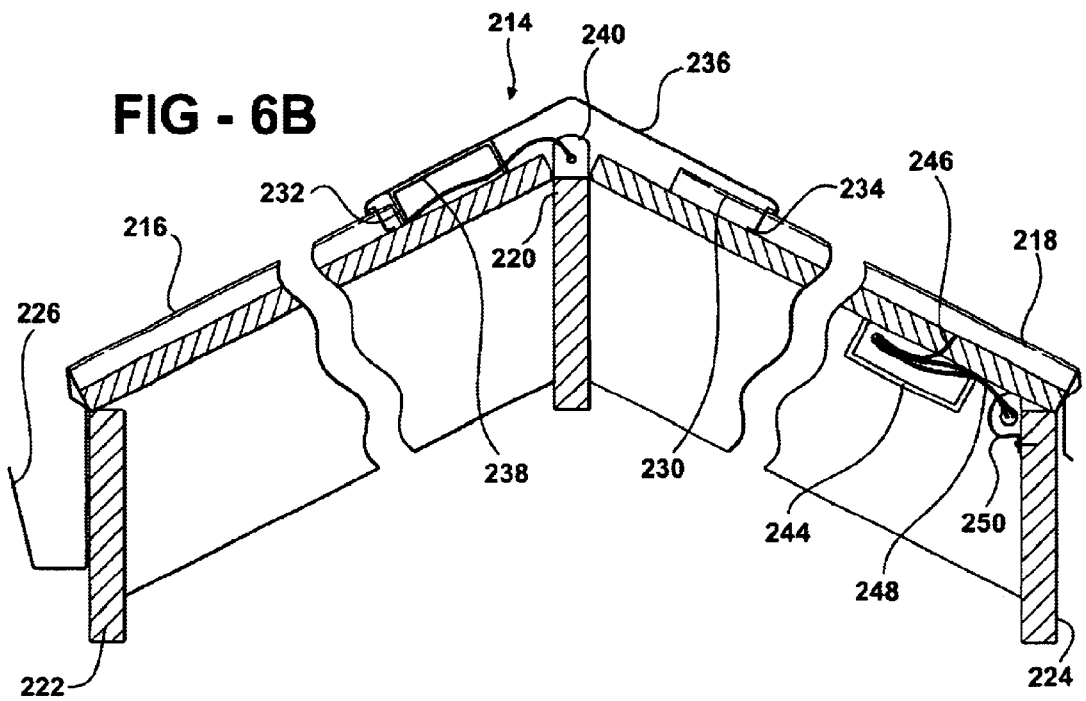

METHOD AND APPARATUS FOR MOUNTING A PHOTOVOLTAIC ROOFING MATERIAL

RELATED APPLICATION

This application claims priority of provisional application Ser. No. 60/275,662, filed Mar. 14, 2001, and entitled "Method and Apparatus for Mounting a Photovoltaic Roofing Material".

FIELD OF THE INVENTION

This invention relates generally to photovoltaic generating structures. More specifically, the invention relates to roof-mounted photovoltaic generating structures and methods for mounting flexible, photovoltaic roofing material onto a roof or deck structure.

BACKGROUND OF THE INVENTION

Photovoltaic devices provide silent, nonpolluting, reliable sources of electrical energy. Rooftops and other portions of building structures provide ideal support surfaces for photovoltaic devices, and a large body of art has been developed relating to methods and apparatus for mounting photovoltaic structures onto buildings.

Thin film photovoltaic devices are particularly advantageous since they are relatively low in cost, flexible, and capable of being manufactured in relatively large areas, by continuous deposition processes. Such thin film devices can be encapsulated in transparent, durable, flexible polymeric bodies, and are ideally suited for building-mounted installations. In some instances, roofing materials can actually be fabricated from webs of photovoltaic material. Such configurations can function as a roofing material and can also provide large amounts of electrical power.

A first example of a photovoltaic array module incorporating a plurality of photovoltaic cell strips is set forth in U.S. Pat. No. 4,574,160, issued to Cull et al. Each cell strip incorporates an electrically conductive substrate layer, a semiconductor body deposited on the substrate layer, and a transparent electrically conductive layer deposited on the semiconductor body. Electrically conductive filaments are alternately connected to contact points on the substrate layer of one cell strip and to contact points on the transparent electrically conductive layer of another cell strip. First and second bus bars are connected to the end of the cell strips of the array to collect the electrical energy created thereby.

A further example of the prior art is set forth in U.S. Pat. No. 4,860,509, issued to Laaly et al., and which teaches a combination form of flexible roofing material including a reinforced single-ply membrane base for adhering to a roof substrate. Laminated upon the base is a structurally flexible layer of solar cells encapsulated and sealed in a flexible intermediate layer of solar radiation transparent plastic protected by a cover layer of weatherproof solar transparent plastic. The roofing is further manufactured as elongated sheets which are rolled up for transport to the site and installed by such as sealing to adjacent sheets of similar single-ply membrane material which may or may not incorporate solar cells.

SUMMARY OF THE PRESENT INVENTION

The present invention, as will be described in greater detail hereinbelow, is directed to an apparatus and method for mounting relatively large area webs of photovoltaic roofing material onto building structures and, in particular, to a peaked roof of such a structure. As known in the pertinent art, such photovoltaic roofing materials are capable of absorbing solar ambient light for conversion into a suitable electrical output.

A plurality of individual and, preferably elongated, webs of photovoltaic material are provided. Each of the webs is preferably of flexible thin film and with a typically centralized and photovoltaically active area. The webs of photovoltaic material typically vary in either or both length and width and may exhibit differing voltage ratings, such as 6, 12, 18, 24 volts.

The photovoltaic material is encapsulated within a polymeric material, projecting beyond both the extending sides and end of the photovoltaically active area, and resistant to ambient conditions. A top surface of the polymeric material is also transparent to photovoltaically active wavelengths. Contact terminals are located in extending fashion from a selected end of each elongated web of photovoltaic material and, as will be further described, function to electrically interconnect the associated web to either additional extending webs or to an electrical junction box or other suitable connector device.

Each succeeding web of material is disposed in a longitudinally extending and partially overlapping relationship upon the exterior surface of the roof structure and so that a first extending edge of a first web is arranged proximate a second extending edge of a further associated web. Additional components such as clamping strips are provided and are configured to engage the first and second webs along their proximate extending edges. Batten caps are affixed to the clamping strips and further function to retain the photovoltaic roofing material on the roof as well as to provide a moisture resistant seal and decorative cover to the clamping strips.

In preferred installation applications, the elongated webs of photovoltaic material extend in a general direction from a lower eave edge of the roof to either an intermediate step and/or from the step to an uppermost ridge, these forming a conventionally known gable end roof. A further hip roof application contemplates the webs of photovoltaic material extending between a valley and ridge of the hip roof, as well as along an extending eave soffit.

Additional installations permit opposing ends of elongated photovoltaic webs to be electrically connected, given structural variations or offsets in pitch which are inherent in eave or ridge cap locations of such roofing structures. The eave and ridge cap applications further permit the installation of such as junction boxes and/or other electrical components.

Yet additional applications of the present invention include the provision of a transport and storage spool and upon which may be wound an overall length of the photovoltaic material. A removable cover of the spool reveals an interior storage compartment suitable for holding such as assembly tools and other devices or implements necessary for installing the photovoltaic material.

A reel stand is provided for dispensing the photovoltaic material from the transport and storage spool. In a further application, the reel stand may be configured to be mounted in a horizontally traversable and underside eave location of the roofing structure and to facilitate drawing, sectioning and affixing lengths of photovoltaic material from the spool and along the roof.

The mounting system of the present invention is readily adaptable to conventional building practices and enables the quick and accurate installation of photovoltaic roofing systems without the need for special training of workers or extensive modifications to conventional building design. These and other advantages will be apparent from the succeeding description of the Figure illustrations and detailed description, which follow.

BRIEF DESCRIPTION OF THE DRAWINGS

Reference will now be made to the attached drawings, when read in combination with the following detailed description, wherein like reference numerals refer to like parts throughout the several views, and in which:

FIG. 5A is a first depiction of an electrical connection established along a ridge and step of a roofing structure according to the present invention;

FIG. 5B is a further depiction of an electrical connection established along an eave soffit;

FIG. 5C is a depiction of an electrical connection established along a ridge alone of a roofing structure;

FIG. 5D is a depiction of an alternate type of electrical connection established along ridge and eave soffits of a roofing structure;

FIG. 5E is a depiction of an electrical connection being established along a ridge where photovoltaic roofing material extends between a valley and ridge of a roofing structure;

FIG. 5F is a depiction of an electrical connection established along an eave soffit for a roofing material mounted on a hip roof;

FIG. 6A shows a depiction of an embodiment of hip and ridge caps for use with roofing structures having different pitches;

FIG. 6B shows a schematic depiction of the electrical connections of FIGS. 5A–5F;

DETAILED DESCRIPTION OF THE INVENTION

Figure 1A:
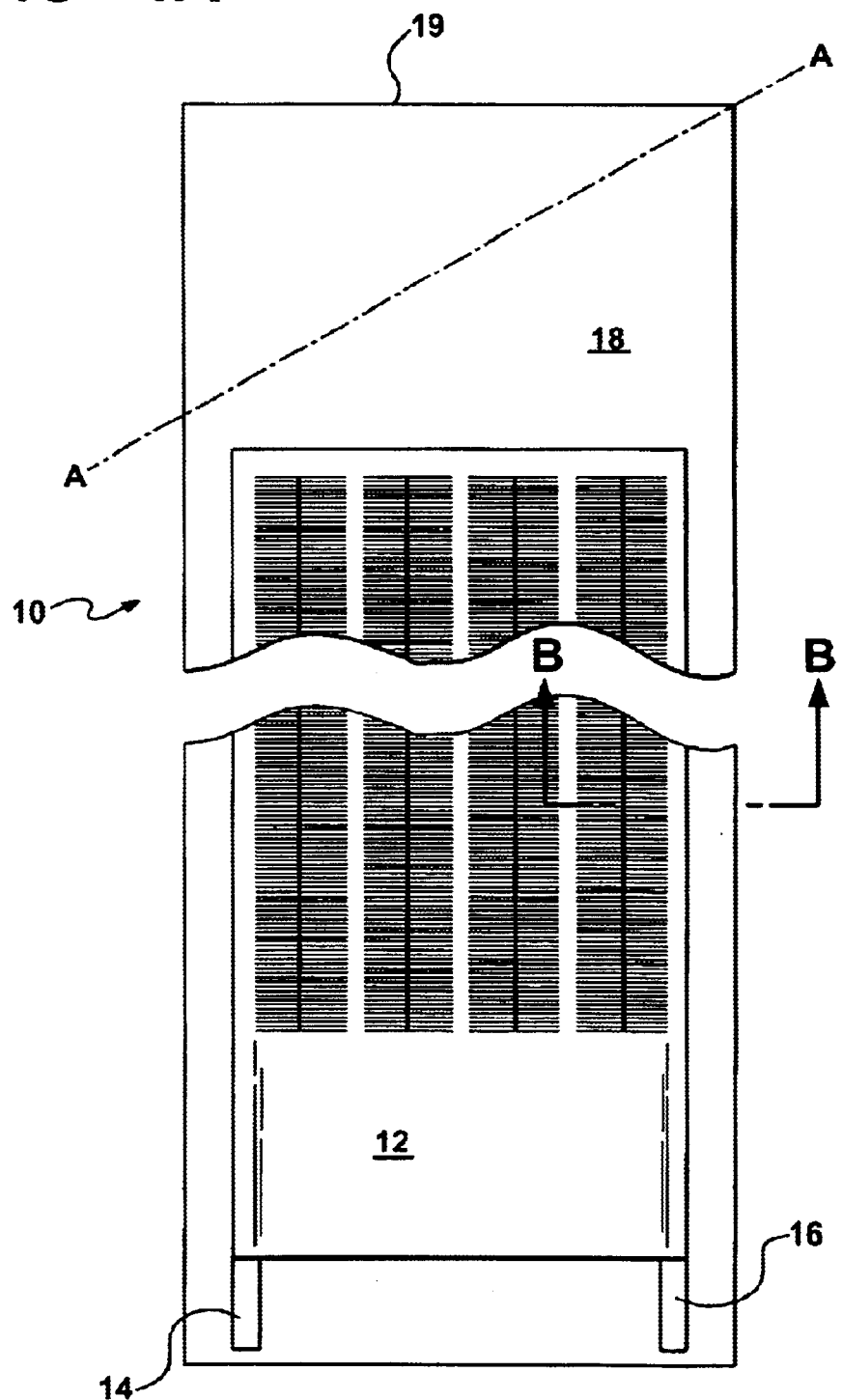
FIG. 1A is a schematic depiction of a web of photovoltaic roofing material of a type which may be utilized in the practice of the present invention.

Referring now to FIG. 1A, a schematic depiction is illustrated at 10 of a web of photovoltaic material according to the present invention. As previously described, the present invention discloses an apparatus and method for mounting relatively large area webs of photovoltaic roofing material onto building structures and, in particular, to a peaked roof of such a structure. As is also again known in the pertinent art, such photovoltaic roofing materials are capable of absorbing solar ambient light for conversion into a suitable electrical output and for use with other known electrical components such as junction boxes and the like.

Referring again to FIG. 1A, the photovoltaic roofing material 10 is provided and which is preferably established in a thin, flexible and substantially elongated configuration, such as flattened and lengthwise extending strips. It is further understood that the shape of the photovoltaic material, while preferably again elongated, is not limited to any specific configuration.

The roofing material 10 includes a photovoltaically active area 12, preferably constructed as a flexible, thin film photovoltaic device. As is known in the art, such devices generally include a body of substrate electrode material having a number of layers of thin film semiconductor material deposited thereupon.

As shown schematically in FIG. 1A, contact terminals 14 and 16 extend from a selected elongate extending end of the photovoltaic area 12 and establish electrical communication with the device 12. Although not illustrated in this figure description, it is understood that the terminals 14 and 16 may be connected to a junction box or other such connector device and as will be further described.

The electrode material of the photovoltaic area 12 is encapsulated within a body of polymeric material 18, which likewise exhibits a thin and generally elongated shape so that it extends a selected distance beyond the elongate extending sides of the photovoltaic 12, in order to ensure a good environmental seal between the body 18 and the photovoltaic area 12.

In addition, the polymeric material 18 extends a greater distance beyond the opposite extending ends of the area of the photovoltaic 12, particularly the top end 19, and which allows for the body of roofing material 10 to be cut to accommodate various roof shapes. The polymeric material 18 is resistant to ambient conditions and further includes a top surface transparent to photovoltaically active wavelengths.

Figure 1B:
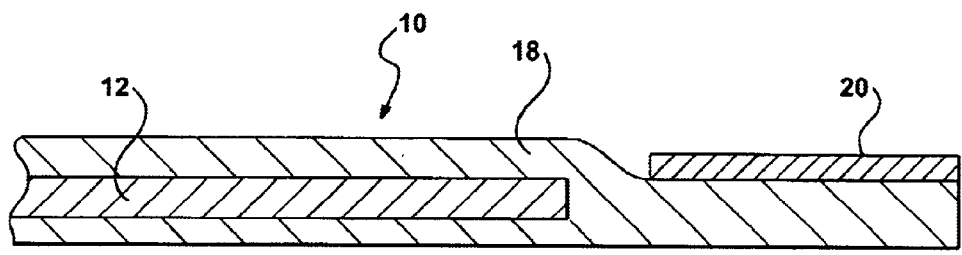
FIG. 1B is a cross-sectional view of the body of photovoltaic material of FIG. 1A taken along line B—B and illustrating its partially overlapping and secured condition upon the roof deck.

Referring now to FIG. 1B, a cross-sectional view of the body of photovoltaic roofing material 10 of FIG. 1A is illustrated along line B—B. As shown in further detail, the body of photovoltaic material 10 again illustrates the photovoltaic area 12 embedded within the body of encapsulating material 18, which in some preferred instances is a fluoropolymer. As further illustrated in this embodiment, the body of photovoltaic material 10, a body of a contact adhesive material 20 is disposed along a projecting side edge thereof of the encapsulating material. In accordance with a first embodiment of the present invention, and which will also be subsequently described in additional detail, webs of photovoltaic roofing material, of the general type shown at 10 in FIGS. 1A and 1B, can be quickly, reliably and securely mounted onto a roofing structure according to the present invention.

Figure 2:
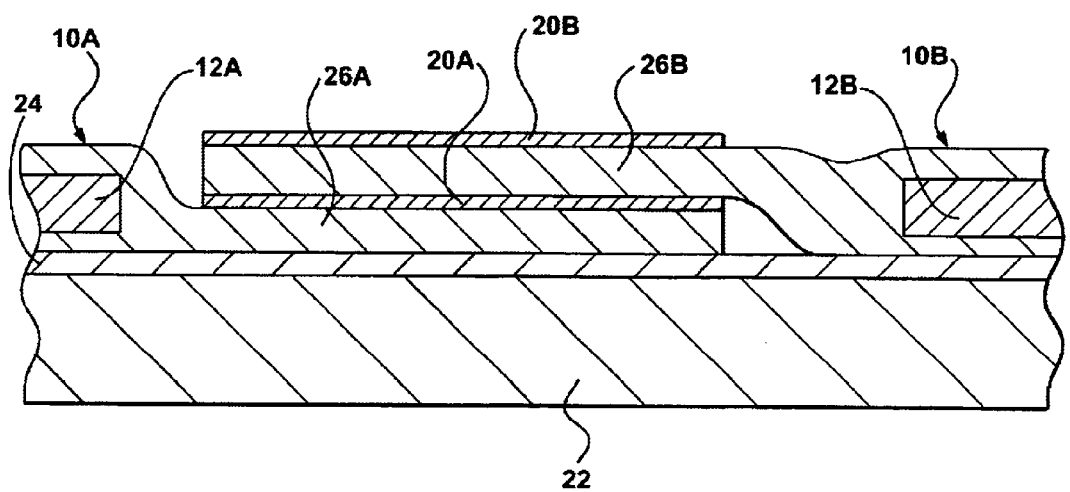
FIG. 2 is a schematic depiction of a first step in one of the mounting methods of the present invention and in which first and second webs of photovoltaic material are disposed in longitudinally arranged fashion.

Referring now to FIG. 2, a cross-sectional view is illustrated of a roof deck 22 and showing a first stage in the mounting of two strips 10A and 10B of photovoltaic roofing material 10 thereonto. Each of the strips 10A and 10B are similar in configuration and construction to that described at 10 and in reference to FIGS. 1A and 1B.

As is further shown in this embodiment, a sheet of membrane material 24 is disposed atop a roof deck 22, the strips 10A and 10B of photovoltaic material being disposed thereatop. The membrane material 24 may, as is known in the art, be selected from such as including tarpaper, polymeric material, natural rubber or the like.

In this first mounting stage of the embodiment of FIG. 2, the two webs or strips of photovoltaic roofing material 10A and 10B are disposed in a longitudinally aligned arrangement atop the roof and which further illustrate portions of spaced apart and longitudinally extending photovoltaic areas 12A and 12B extending in unobstructed and likewise fashion. As will be further described, the longitudinally extending and affixing direction of the strips along the roof may be either in parallel to the direction of the eave edge or, alternatively, from the (lower) eave edge to (upper) ridge; this latter application being preferable in certain installations of the photovoltaic and as will be subsequently described.

Referring once again to FIG. 2, a first (polymeric) edge 26A of the first web 10A is substantially overlayed or overlapped by a second (polymeric) edge 26B of the second web 10B. A body of a contact adhesive material 20A, such as may be coated upon a surface of the first edge 26A of the first web 10A, serves to affix and retain the overlaying/overlapping edge 26B of the second web 10B.

Figure 3A:
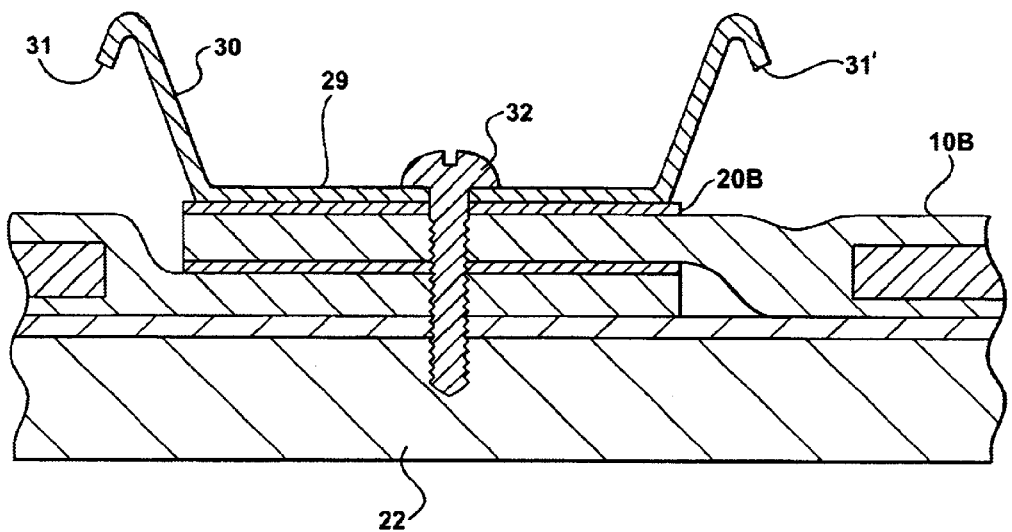
FIG. 3A is a depiction of a second step in the mounting method of the present invention and in which a clamping strip is disposed atop a body of adhesive material of an overlaying and succeeding strip and affixed to the roof deck by means of a screw.

Referring now to FIG. 3A, a succeeding and second step in the mounting process of FIG. 2 is shown. As illustrated therein, a clamping strip 30 is disposed atop a further body of contact adhesive material 20B, in turn associated with a surface of the second edge 26B of the second strip 10B. The clamping strip 30 is illustrated in cross-sectional cutaway and is understood to extend in a desired lengthwise manner, such as corresponding to the overall length of strips 10A and 10B of photovoltaic material.

The clamping strip 30, as shown in the cross-sectional cutaway of FIG. 3A, is further constructed of a suitable material having the necessary properties of strength and resiliency, as well as flexibility, and may be selected from different types of metals, metal alloys or plastics. A substantially flattened and central area 29 of the strip 30 is provided (in adhering fashion over the uppermost polymeric edge 26B) and first and second arcuate extending and curled ends of the clamping strip 30 are shown at 31 and 31' extending from first and second sides of the central area 29, respectively. The clamping strip 30 is affixed to the roof deck 22 such as by a screw 32 or other suitable and conventionally known fastener. The pressure sensitive adhesive (sealant) material, again referenced here at 20B, serves to further adhere the clamping strip 30 to the overlapping edges 26A and 26B of the photovoltaic strips 10A and 10B of roofing material and also serves to seal a passageway established by the pre-drilling and installation of the screw 32 through the edges 26A and 26B, the membrane material 24 and into the roof deck 22.

Figure 3B:
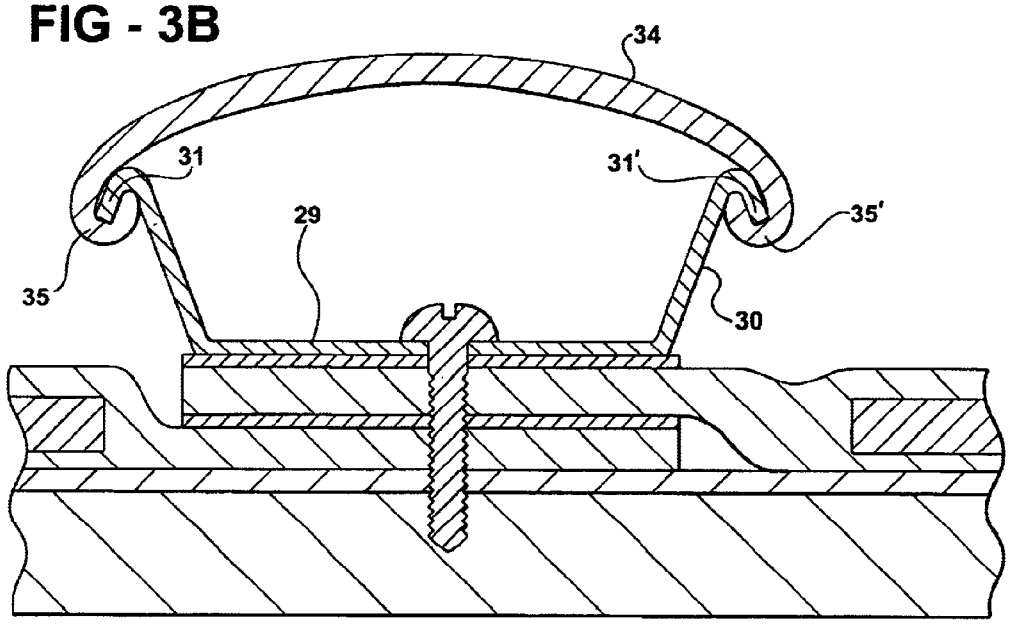
FIG. 3B is a depiction of a third step in the mounting method of the present invention and in which a batten cap is snap-fitted over the clamping strip and in order to provide a moisture resistant seal and decorative covering.

Referring further to FIG. 3B, a final step in the assembly process includes the provision of a batten cap 34 which is fitted onto the clamping strip 30 in the manner illustrated. As with the clamping strip 30, the batten cap 34 is constructed as a lengthwise extending component and preferably exhibits material and performance characteristics similar to that of the clamping strip 30. The batten cap 34 likewise exhibits an arcuate configuration, as illustrated in the cross-sectional cutaway of FIG. 3B, and with opposite and inwardly curled ends 35 and 35', within which are snap fit the curled ends 31 and 31' of the clamping strip 30.

The batten cap 34 in FIG. 3B may also incorporate a sealant material (not shown). The batten cap 34, in any preferred application, is intended to provide a moisture resistant seal and decorative cover for the clamping strip 30 and for moisture-proof and wind-resistant affixation of the strips of photovoltaic material (such as again at 10A and 10B) to a roof deck 22.

As previously described, the clamping strip 30 and batten cap 34 may be fabricated from any resilient material such as metals or polymers. Specifically preferred materials include high strength engineering polymers such as nylons, ABS and the like. Likewise, metal such as aluminum or steel may be similarly employed.

Figure 3C:
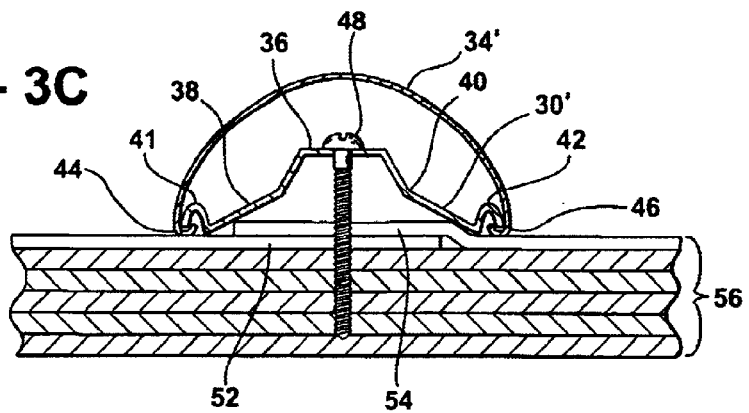
FIG. 3C is a depiction of a second embodiment of a clamping strip and batten after installation and in which the associated edges of the strip and batten abut against a top surface of the webs of photovoltaic material.

Referring now to FIG. 3C, a first cross-sectional cutaway is illustrated of an alternately configured clamping strip 30' and batten cap 34', in comparison to the clamping strip 30 and batten cap 34 as shown in FIG. 3B. In particular, the clamping strip 30' in this configuration is constructed of such as a Galvalume material and exhibits a flattened central area 36 with opposite and downwardly/outwardly extending and angled legs 38 and 40. The legs 38 and 40 exhibit a reverse bend configuration as shown and terminate in arcuate extending and downwardly curled ends 41 and 42, respectively.

The batten cap 34' exhibits an interiorly hollowed and substantially "dome" shape terminating in uniquely configured and inwardly curled ends 44 and 46 at opposite ends, and further such that the arcuate and inwardly curled ends 44 and 46 receive the associating downwardly curled ends 41 and 42 of the clamping strip 30'. Prior to installation of the batten cap 34', a screw or other suitable fastener 48 is inserted through an aperture defined in the flattened central area 36 of the Galvalume clamping strip 30' and pierces through such as the overlapping edges 52 and 54 of adjacent strips of photovoltaic material, as well as succeeding waterproof membrane and roof decking, generally referenced at 56.

In this fashion, the interengaging and associated curled edges 41 & 42 (clamping strip 30') and 44 & 46 (batten cap 34') abut against the top surfaces of the adjoining strips of photovoltaic material and in such a manner as to enclose the overlapping junction established by the edges 52 and 54. Such a connection provides an additional degree of moisture impermeability and environmental sealing of the extending edge connection of the photovoltaic strips.

Referring now to FIG. 3D, once again illustrated is the clamping strip 30' and batten cap 34' in use when installing strips of photovoltaic material, such as illustrated by associated and overlapping edges 58 and 60, upon an existing roof and roof deck, such as are shown at 62 and 64, respectively. A leveling bracket 66, such as may be provided as an 18 gauge Galvalume material, is mounted upon the roof such as with self-tapping mounting screws (not shown). A fastener such as an elongated stagger screw 68 inserts through the hole in the central area 36 of the clamping strip 30' (again prior to the application of the batten cap 34') and successively through the overlapping polymeric edges 58 and 60 of the photovoltaic strips, a central area of the bracket 66, and into the succeeding layers of the roof 62 and roof deck 64.

Figure 3D:
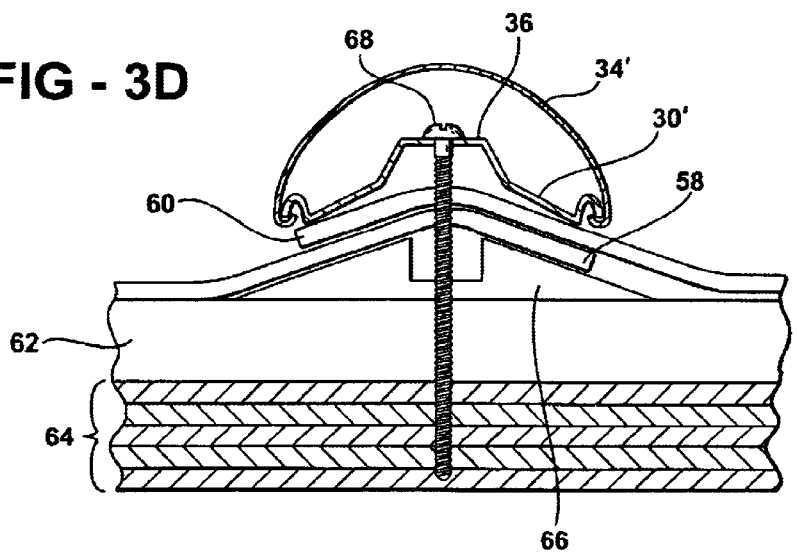
FIG. 3D is a depiction of a third embodiment of a clamping strip and batten cap for securing the device with a leveling bracket of an existing roofing.
Figure 3E:
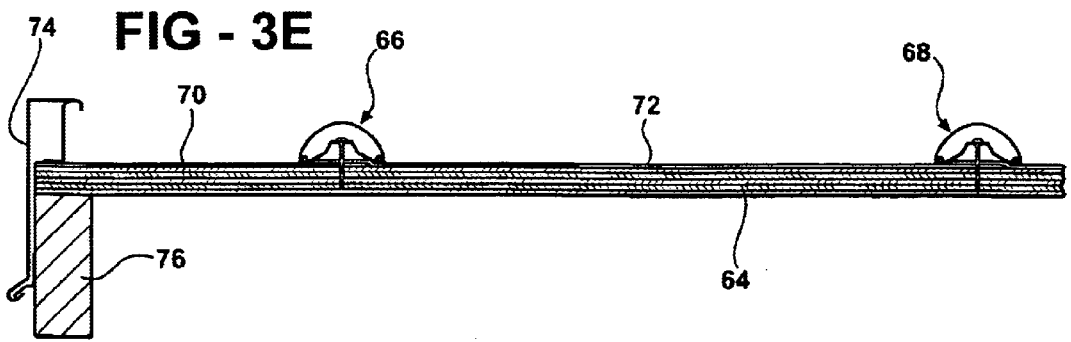
FIG. 3E is a depiction of portions of the device being secured with clamping strips, batten caps, and rake trim according to the present invention.

Referring further to FIG. 3E, an applicational view is shown of first 66 and 68 combinations of clamping strips and batten caps (such as shown in FIGS. 3C and 3D) and in which succeeding strips 70 and 72 of photovoltaic material are secured upon the roof deck 64. Additional illustrated features in the variant of FIG. 3E include provision of a rake trim piece 74 securable to a gable end fascia 76 of the roofing structure and securing a proximate extending edge of the photovoltaic strip 70. Additional elements, such as peel and stick adhesives or heat sensitive glues may be provided for assisting in securing the rake trim piece 74 to the underlaying edge fascia 76.

Figure 4A:
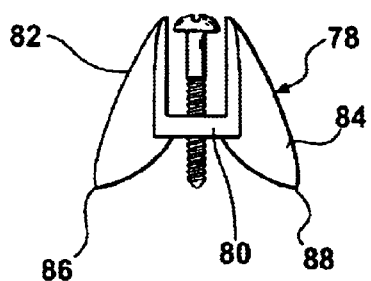
FIG. 4A is a first schematic depiction of another embodiment of clamping strip for mounting photovoltaic material according to the present invention.

Referring now to FIG. 4A, a first depiction is shown of a clamping strip 78 according to a further preferred variant of the present invention. The clamping strip 78 is again illustrated in cross-sectional cutaway and is constructed of a suitable material, such as an elongated and extruded aluminum. Similarly, a high strength engineering plastic, as well as other types of metal, metal alloys, and plastics may be employed.

The clamping strip further exhibits a central and apertured bracket 80, from opposite sides of which extend downwardly and arcuately configured and downwardly sloping sides 82 and 84, each of which in turn terminating in a pointed lower end (see at 86 and 88, respectively for sides 82 and 84). A screw 86 or other suitable fastener inserts through the bracket 80 and to secure to a roof location (not shown).

The mode of use of the clamping strip 78 of FIG. 4A differs from that of the clamping strips previously described in that the clamping strip 78 is affixed to the roof structure (see also at 90 in FIG. 4C) prior to the time the webs of photovoltaic roofing material (not shown) are laid onto the roof. In use, edge portions of adjacent strips of photovoltaic roofing material, see at 92 and 94 in FIG. 4C, are laid up, along and beyond top edges of the sloping sides 82 and 84 and in curling fashion within a top end of the central bracket portion 80.

Figure 4B:
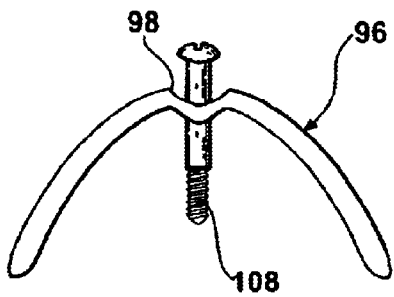
FIG. 4B is a second schematic depiction of a batten cap in use with the clamping strip of FIG. 4A.
Figure 4C:
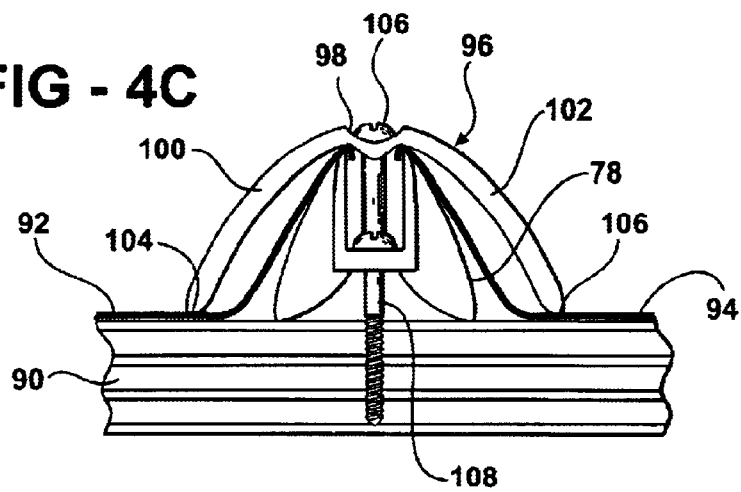
FIG. 4C is a further depiction of the mounting method utilizing the clamping strip and batten cap.

Completing the assembly of FIGS. 4A–4C, and referring specifically to FIGS. 4B and 4C, a batten cap 96 is shown and which may also be constructed of anodized extruded aluminum or like material. The batten cap 96 includes a central recessed portion 98, from opposite sides of which extend downwardly and outwardly sloping sides 100 and 102 which terminate in bottom extending edges 104 and 106, respectively. The batten cap 96 is positioned in overlaying and covering fashion over the clamping strip 78 and is secured to the clamping strip by means of a self-tapping screw 108 extending through an aperture in the central recessed portion 98 and which engages the clamping strip 78 (see FIG. 4C). Preferably, a sealing gasket (such as constructed of Neoprene or the like) is included in combination with the batten cap screw 106 to provide an environmentally tight seal. Once affixed, and as is best again shown in FIG. 4C, the batten cap 96 cooperates with the clamping strip 78 to retain the photovoltaic roofing material (see again strips 92 and 94) on the roof 90.

Figure 4D:
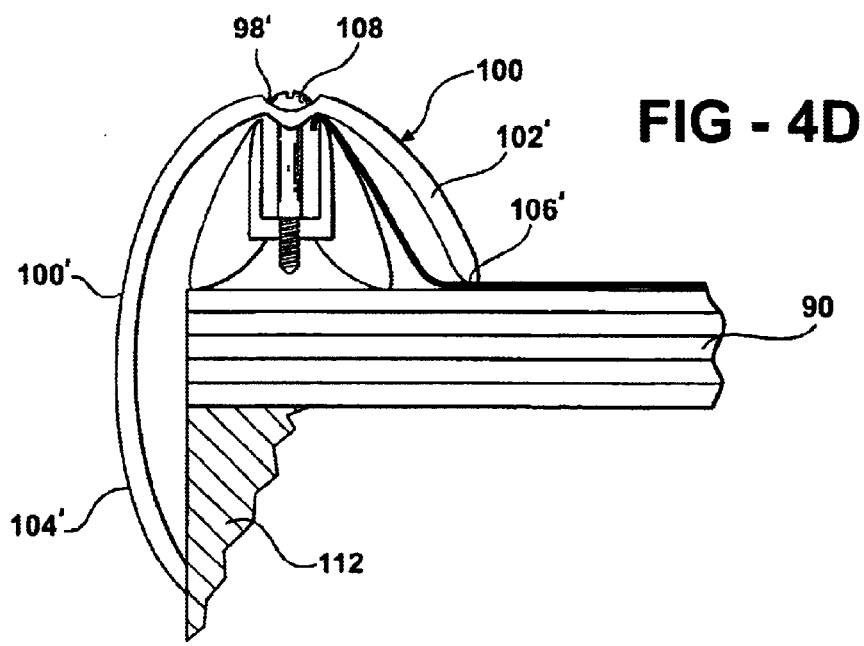
FIG. 4D illustrates a further alternative depiction of a batten cap for use as rake trim with the clamping strip of FIG. 4A.

Referring to FIG. 4D, a variant configuration is depicted of a batten cap 110 which may be advantageously employed at the edges of the roof. As is seen from this figure, the batten cap 110 is constructed similar to that shown at 96 in FIG. 4B, with the exception of a first downwardly and outwardly sloping side 100' projecting below an edge of the roof deck 90 and terminating in an inwardly extending edge 104' engaging a fascia 112 of the building. The remaining structural aspects of the batten cap 100, including the second extending side 102' with bottom edge 106' and central recessed area 98' through which extends the self-tapping screw 108. Not further shown but understood to exist is the corresponding screw 86 associated with the clamping strip 78 (see also FIG. 4C) for engaging within the roof deck 90.

In view of the teachings presented herein, and with reference collectively to FIGS. 4A–4D, other modifications and variations of the installation system will be apparent to one of skill in the art. For example, sealant materials, gaskets and the like may be incorporated into the clamping strip and/or batten cap structures. Likewise, other affixation members such as locking tabs, nails and adhesives may be substituted for the screws illustrated herein. As also previously described, the various mounting methods disclosed by the present invention allow for the use of very large area strips of photovoltaic roofing material 10 having terminal connections at their ends, and hence simplifies the establishment of electrical connection to the devices.

Referring now to FIGS. 5A–5D, illustrated are a succession of applications of photovoltaic material to varied types of gable end roofs (FIGS. 5A–5D), as well as roof deck valleys (FIG. 5E) and hip roof applications (FIG. 5F). In each illustration is shown a schematic depiction of a particular mode of connection and by which the associated and end extending contact terminals of the applied photovoltaic strips may be electrically connected. Although not further shown, it is again understood that the clamping strips and batten caps, illustrated in varying form throughout the preceding embodiments, may be employed in each of the following applications.

Referring again to FIG. 5A, a first application is illustrated at 114 and shows a gable roof with a lower most eave edge 116, an intermediate spaced apart and parallel extending step 118 and a likewise parallel extending and uppermost ridge 120. As is further shown by the perspective of FIG. 5A, the roofing structure includes a step configuration with a first peak 122 and second partially overlapping and uppermost extending peak 124.

A number of photovoltaic roofing strips, see individual pluralities 126 and 128, are disposed in extending fashion upon and along each of the associated peaks 122 and 124 in a direction perpendicular to the eave 116, step 118 and ridge 120. As such, the strips 128 extend from the ridge 120 to the step 118, and the additional strips 126 from the step 118 to the eave soffit 116. Electrical connection is readily established at either or both ends of each panel, such as is referenced by communication lines 130 and 132 extending in approximation to the step 118 and ridge 120, respectively, and which are understood to communicate with the terminals extending from each individual one of the strips. Hence, the electrical connections may be terminated at the roof ridge 120, at the step 118 or at the eave soffit 116.

Referring to FIG. 5B, a second application 134 illustrates a single roof peak 122, with a defined plurality of photovoltaic strips 136 extending between the eave 116 and ridge 120 of the roofing structure. In this application, electrical communication between the strips 136 is established along the eave 116 alone and as shown by communication line 138.

Referring to FIG. 5C, a third application 140 reverses that shown in FIG. 5B and with a similarly arrayed plurality of photovoltaic strips 142 electrically intercommunicating along a line 144 extending proximate the ridge 120 location. A further application 146 shown in FIG. 5D establishes a plurality of photovoltaic strips 148 arranged in an intermediate lapping fashion, see at 122, and electrically communicated at both the eave 116 and ridge 120 locations, such as is referenced by communication lines 152 and 154, respectively.

As further shown in the applications 114, 134, 140 and 146 ranging from FIGS. 5A–5D, additional interconnections may also be established along and underneath the rake soffit, such as referenced by example at 156 in FIG. 5D. It is also contemplated that the use of large area cells eliminates the need for penetrating the roof deck or running a plurality of electrical connections across a roof surface, as is required when smaller area photovoltaic devices are used.

Referring further to FIG. 5E, an alternate roof deck application is shown at 158 and which includes a first roof deck 160 and second roof deck 162. The roof decks 160 and 162 are established in an angled configuration define a valley 164 therebetween which extends from a top ridge end 166 to a bottom eave end 168. The roof decks 160 and 162 likewise include eave extending edges 170 and 172 which meet at the eave end 168. In this application 158, staggered pluralities of photovoltaic strips, such as are shown at 174 and 176, are arranged along both the roof decks 160 and 162 and, for ease of illustration, is only illustrated along the first roof deck 160. Although not further illustrated, suitable communication lines extend along either the ridge, valley or eave edges.

Referring still further to FIG. 5F, an application 178 is shown of the photovoltaic strips secured upon a hip roof. In this application, the associated and adjoining roof decks terminate in both cave soffit edges 180 and 182, respectively, as well as joint edge boundary 184 extending between a top ridge end and the bottom cave end. Additional pluralities of photovoltaic strips 186 and 188 are secured along the respective roof decks in extending and intercommunicating fashion along the edge boundary 184. Although not shown, additional pluralities of photovoltaic strips are secured along additional (such as third and fourth) sides of the hip roof and likewise intercommunicate along additional joint edge or top ridge boundaries.

In such instances as shown in FIG. 5F, the photovoltaic panels 186 and 188 may be cut at an acute angle at one end, such as again referenced along joint edge 184 and again taking into account the previous description of the structure illustrated in FIG. 1A, to accommodate the hip structure. Again, electrical connections may be readily made at the eave soffit.

Referring now to FIG. 6A a depiction is given at 190 of a first specific installation for facilitating connection between such as first 192 and second 194 ridge caps associated with roof decks 196 and 198, respectively and also as previously disclosed. The first and second ridge caps 192 and 194 are illustrated in the side profile of FIG. 6A by their associated batten caps and also illustrated are flexible forward extending edges, 200 for first ridge cap 192 and 202 for second ridge cap 194, which extend in substantially opposing fashion to one another.

A pair of zee closure elements, see at 204 and 206, are provided for securing the battens associated with the ridge caps 192 and 194. Screw fasteners 208 and 210 engage through a base portion of an associated zee closure element and secure the same to its associated roof deck 196 and 198. The zee closure elements may also be riveted at locations to their associated batten caps. A snap-on hip and ridge cap 212 is illustrated diagrammatically in FIG. 6A and engages the opposing closure elements 204 and 206 to complete the connection.

Referring to FIG. 6B, a further depiction is shown at 214 of a ridge cap termination for shrouding electrical connections associated with the photovoltaic strips. In particular, a roof deck in this illustration includes such as first 216 and second 218 peaked sides (illustrated in reduced length fashion) which terminate in a top extending ridge 220 at a joint end, as well as first and second side extending fascias (see at 222 and 224) which are arrayed at opposite ends. Also shown is a gutter element 226, such as which may extend along an exterior face of the first fascia 222.

A first batten cap 228 is illustrated in upwardly angled and arrayed fashion along the first peaked side 216, a second batten cap 230 likewise extending in similar fashion along the second peaked side 218. First and second zee closure elements, see at 232 for batten cap 228 and at 234 for batten cap 230, are secured in a manner consistent with that previously described in FIG. 6B. A ridge cap 236, such as which again may be constructed of a 24 gauge Galvalume material, is engaged in extending fashion between the zee closure elements 232 and 234 and over the top ridge 220 of the roof deck.

Electrical components associated with the ridge cap termination depiction 214 include such as a junction box 238 arrayed on the first peaked side 216 and enclosed by the ridge cap 236, as well as a wire chase 240 extending from the junction box 238 and extending in a direction along the top ridge 220. In this fashion, the associated electrical connections, or terminals, of the succeeding plurality of photovoltaic strips may be communicated to the wire chase 240 and junction box 238.

Additional components of the depiction 214 include such as an additional junction box 244 located on an underside face of the second peaked side 218 of the roof deck. A series of wires 246 extend from the junction box 244, through holes drilled in the peaked side 218 of the roof deck, and typically exit from a bottom facing side of the laminate material associated with the top installed photovoltaic elements. Finally, additional wires 248 associated with the junction box 244 extend through a wire chase 250 and such as in order to route the generated electrical load to a suitable output location. As noted above, the capability of achieving such edge termination eliminates labor and structural problems inherent with smaller area devices.

As previously described, the preferred photovoltaic roofing material for use in the present invention is based upon flexible, large area, thin film photovoltaic devices which are laminated between environmentally resistant polymeric sheets. This type of material readily lends itself to being shipped and handled in a roll form and, referring further to FIG. 7A, a depiction is given of a novel form of roll packaging which may be used in connection with such materials.

As specifically shown, an elongated roll of photovoltaic material (not shown in FIGS. 7A and 7B) may be rolled onto a relatively large core reel or spool 252 having a central annular and recessed surface 254 and annularly enlarged and opposite extending ends 256 and 258 and which allows the reel to be rolled across a surface without harm to the photovoltaic material retained thereupon. The size and configuration of the spool 252 prevents undue bending or kinking of the photovoltaic material as it is wound thereupon and a recessed area 260 defined in a top surface of the spool 252 functions to protect shipping labels, as well as to hold instruction manuals and the like.

Figure 7A:
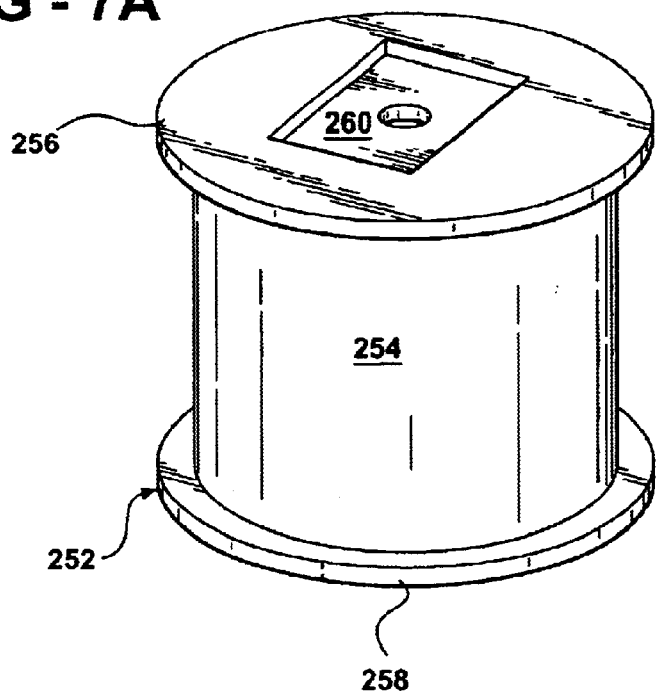
FIG. 7A is an illustration of a transport and storage spool for use in one embodiment with the photovoltaic material of the present invention.
Figure 7B:
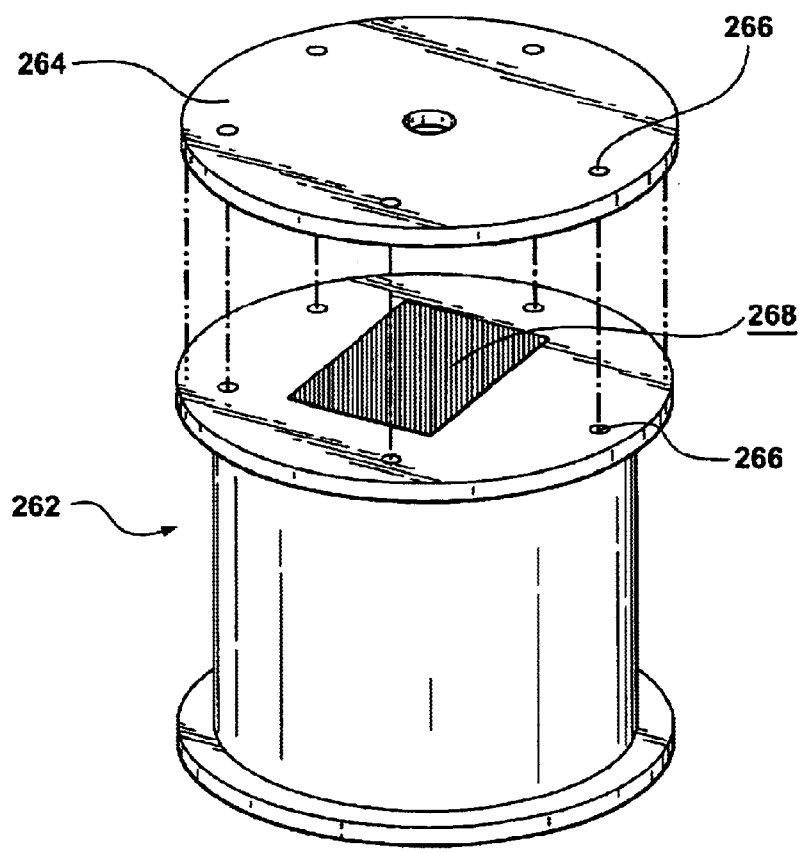
FIG. 7B shows the transport and storage spool of FIG. 7A, with an associated and removable cover in partially exploded fashion, and which reveals and interior storage compartment for holding such as assembly tools and other devices necessary for installing the photovoltaic material.

Referring further to FIG. 7B, a variation 262 is shown of the spool design otherwise shown in FIG. 7A and which further illustrates an associated and removable cover 264, and which is typically shaped in a suitable annular manner to conform to the outline of the top surface, see at 266, of the spool 262. Aligning apertures defined between the cover 264 and top surface 266 receive mounting fasteners (not shown) and, upon removal of the same, the cover 264 may be detached to reveal a suitable and geometrically defined aperture 268 defined within the interior core of the spool 262 and which provides interior storage for junction boxes, installation hardware, operational manuals, installation manuals and the like.

Figure 8:
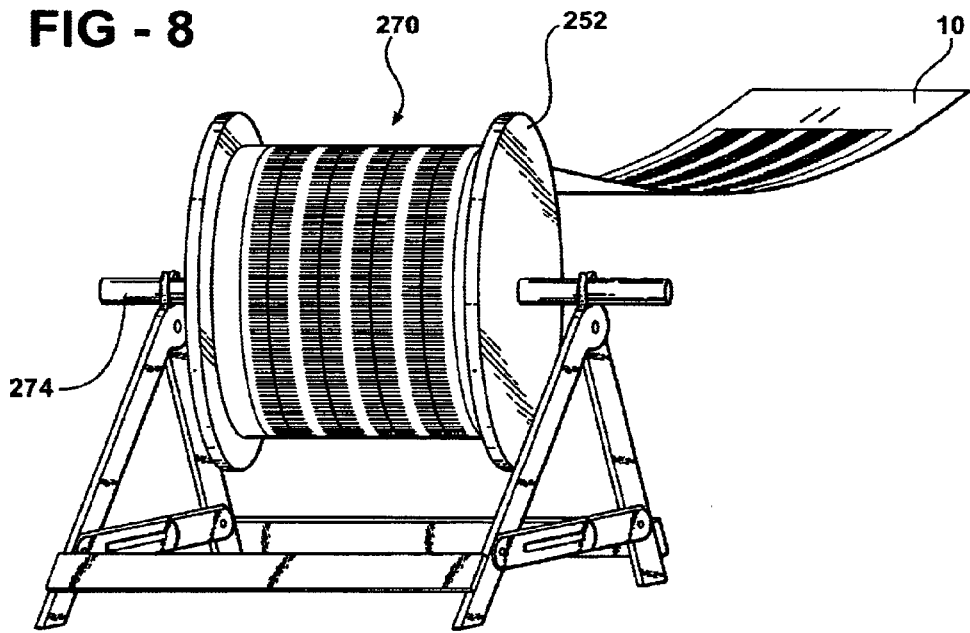
FIG. 8 is an illustration of a reel stand for dispensing the photovoltaic material from the transport and storage spool of FIGS. 7A and 7B and according to the present invention.

As depicted at 270 in FIG. 8, an overall length of photovoltaic material contained within the reel or spool 252 can be mounted onto a stand or cradle 272. The spool 252 is rotatably supported by an axle 274 and to permit the ready deployment of photovoltaic material 10 therefrom. Although not specifically shown, the reel of photovoltaic material may be serrated or broken at given distance increments and in order to facilitate sectioning from the spool. Along these lines, the arrangement of the photovoltaic areas and location of the contact terminals may be taken into consideration in the design of the reel and in order to provide efficient sectioning of given lengths of photovoltaic material during installation.

Figure 9:
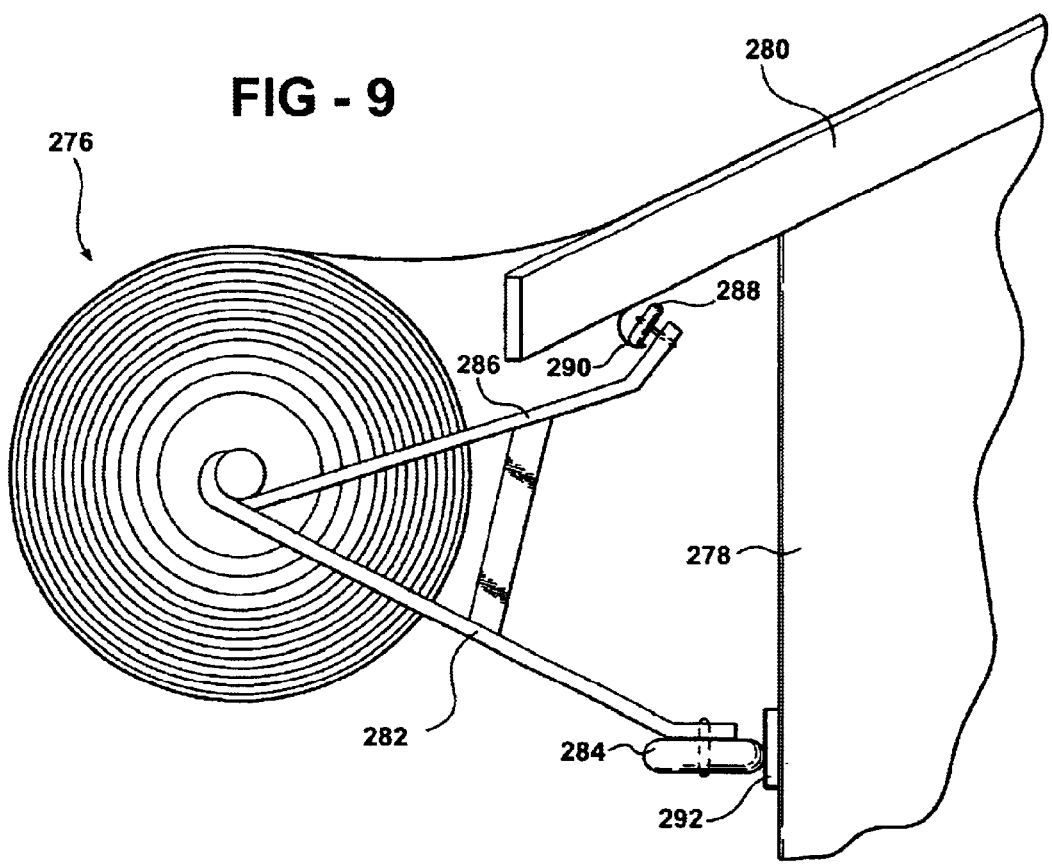
FIG. 9 is an illustration of an alternately configured eave-mounted reel stand established on a lengthwise traversable trolley and for supporting the dispensing spool of FIG. 7A during unreeling and affixing of the photovoltaic material upon the roofing structure according to the present invention.

Referring to FIG. 9, the stand or cradle can be modified, as shown at 276, for supporting the spool (the enlarged end of which is removed in FIG. 9 for ease of illustration) in lengthwise traversable fashion along a vertically extending eave edge 278 of a roof deck 280. In particular, and considering again the side cutaway illustration of FIG. 9, angled legs associated with a first side of the cradle (see at 282), each terminate in a roller (see at 284); whereas the other pair angled legs 286 each terminate in a further roller (at 288).

Rails are mounted to underside rafter locations (290) of the extending roof deck 280, as well as to vertically distanced location (292) of the eave edge 278 and the rails 290 and 292 seat, respectively, the rollers 284 and 288 in such a fashion that that the trolley assembly may move along the edge of the roof.

In this manner, the reel stand and spool may be traversed to a desired location, specifically measured lengths of the flexible photovoltaic material 10 unreeled and sectioned from the spool and affixed directly onto the roof, and the trolley traversed to a further installation location. Referencing again the earlier disclosure of FIGS. 5A–5F, a preference in one application for applying the photovoltaic strips in extending fashion from a lower eave edge of the roof structure is confirmed by the arrangement of FIG. 9, however it again being understood that the method and apparatus of the present invention contemplates any suitable mounting direction of the photovoltaic material upon flat, peaked, or otherwise configured roofing structures.

Additional structure, although not shown, may also include provision of a cutting or knife edge to the trolley assembly, to facilitate sectioning of the lengths of photovoltaic material. Also, the roller assemblies 284 and 288 may also be made adjustable in one or more directions to accommodate different mounting arrangements of associated horizontally traversable rails and the like.

Figure 10A:
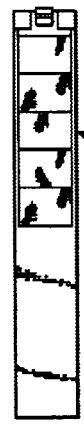
FIG. 10A illustrates a first depiction of a web panel, capable of being used with a roofing spool or unreeling application such as shown throughout FIGS. 7–9, and such as a 6 volt output panel.
Figure 10B:
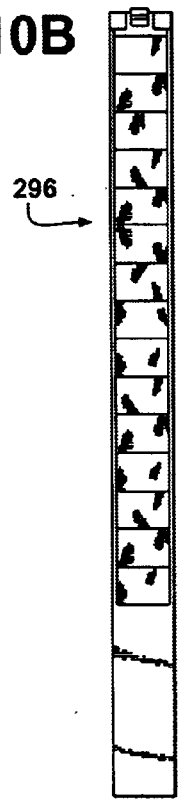
FIG. 10B illustrates a second depiction of an 18 volt output panel.
Figure 10C:
FIG. 10C illustrates a third depiction of a 24 volt output panel.
Figure 10D:
FIG. 10D illustrates a fourth depiction of a 12 volt output panel.
Figure 10E:
FIG. 10E illustrates a fifth depiction of a blank web panel.

Finally, FIGS. 10A–10E depict several panel variations that may be used in particular with the roofing spool, cradle, and/or traversable trolley featured in the variants of FIGS. 7–9. Specifically, FIG. 10A illustrates a first depiction 294 of a web panel and such as a 6 volt output panel. Succeeding panels are depicted at 296 (FIG. 10B) for an 18 volt rating, at 298 (FIG. 10C) for a 24 volt rating, at 300 (FIG. 10D) for a 12 volt rating, and at 302 (FIG. 10E) for a blank or filler/spacer panel. Each of the web panels 294–302 depicted herein are of a suitable thin cross-sectional and flexible construction as previously described.

The foregoing drawings, discussion and description are illustrative of particular embodiments and features of the apparatus and method of the present invention, and are not meant to be limitations upon the practice thereof. Numerous modifications and variations will be readily apparent to one of skill in the art. It is the following claims, including all equivalents, which define the scope of the invention.

What is claimed is:

1. A method of mounting a photovoltaic roofing material onto a roof, said method comprising the steps of:
   providing a first and a second elongated web of a photovoltaic roofing material, each web having a polymeric edge which extends therefrom;
   disposing said first and second webs on the roof in a longitudinally aligned relationship with one another and so that the polymeric edge of said first web is disposed in an overlapping relationship with the polymeric edge of said second web;
   affixing a clamping strip to the roof, said clamping strip being configured and disposed so as to overlie the overlapping polymeric edges of said first web and said second web; and
   affixing a batten cap to said clamping strip; whereby said batten cap and clamping strip cooperate to retain said photovoltaic roofing material upon said roof.

2. The method of claim 1, further comprising the step of applying a body of contact adhesive material upon at least one of said edges of said first and second webs.

3. The method of claim 1, further comprising the step of applying a sheet of membrane material upon the roof, over which are disposed said first and second webs of photovoltaic material.

4. The method of claim 1, further comprising the step of establishing electrical communication to each of said webs of photovoltaic roofing material.

5. The method of claim 4, further comprising the step of establishing electrical communication in a region of a soffit of the roof.

6. The method of claim 4, further comprising the step of establishing electrical connection in a region of a ridge of the roof.

7. The method of claim 4, further comprising the step of establishing electrical communication proximate a transverse extending edge of each of said webs of photovoltaic material.

8. The method of claim 1, further comprising the step of winding said first and second webs of roofing material upon a spool.

9. The method of claim 8, further comprising the step of affixing said spool upon a trolley traversable in a substantially horizontally extending fashion along an eave edge of the roof.

10. A method for assembling a traversable cradle assembly for use with an extending eave edge of a roof, said cradle assembly applying an elongated web of photovoltaic material upon the roof and comprising the steps of:

providing a spool upon which is wound the web of photovoltaic material;

providing a cradle to which is rotatably secured said spool;

affixing said cradle to the eave edge of the roof so as to be movable therealong;

drawing a first length of said web of material from said spool and onto the roof;

sectioning said first length and affixing the same to the roof;

traversing said cradle along the eave edge to a further location; and drawing a second length of said web of material from said spool and onto the roof in a partially overlapping manner relative to said first length.

11. The method of claim 10, further comprising the step of affixing a clamping strip to the roof, said clamping strip being configured and disposed so as to engage said overlap between said first and second lengths.

12. The method of claim 11, further comprising the step of affixing a batten cap upon said clamping strip.

13. The method of claim 10, further comprising the step of affixing rails to the eave edge for receiving rollers associated with said cradle assembly.

14. A photovoltaic roofing material, comprising:

a first and a second elongated, substantially thin, and flexible web of material, each web including a generally central photovoltaic area encapsulated within a polymeric material, said polymeric material including both side and end extending polymeric edges which project beyond said photovoltaic area;

a pair of contact terminals extending from a selected end of each flexible web and establishing electrical communication with the respective photovoltaic area; wherein a polymeric edge of the first web is disposed in a substantially overlapping relationship with a polymeric edge of said second web; and an elongated clamping strip defining, in cross section, a substantially flattened central area with first and second extending and arcuately configured ends, said clamping strip being engaged over said overlapping edges of said first and second webs.

15. The roofing material of claim 14, further comprising a contact adhesive material applied upon at least one of said overlapping edges.

16. The roofing material of claim 14, further comprising an elongated batten cap defining, in cross section, a substantially arcuate shape with configured ends for engaging, in substantially snap-fit fashion, over said configured ends of said clamping strip and, in combination with said clamping strip, retaining said webs of material upon a roofing installation.

17. The roofing material of claim 16, further comprising screw fasteners associated with at least one of said clamping strip and batten cap and for securing the same upon the roof.

* * * * *